(12) United States Patent
Akamatsu et al.

(10) Patent No.: US 11,423,953 B2
(45) Date of Patent: Aug. 23, 2022

(54) COMMAND TRIGGERED POWER GATING FOR A MEMORY DEVICE

(71) Applicant: Micron Technology, Inc., Boise, ID (US)

(72) Inventors: Hiroshi Akamatsu, Boise, ID (US); Kwang-Ho Cho, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 162 days.

(21) Appl. No.: 16/885,912

(22) Filed: May 28, 2020

(65) Prior Publication Data

US 2021/0375332 A1    Dec. 2, 2021

(51) Int. Cl.
*G11C 16/04* (2006.01)
*G11C 5/14* (2006.01)
*G06F 11/08* (2006.01)
*G06F 3/06* (2006.01)

(52) U.S. Cl.
CPC ............ *G11C 5/148* (2013.01); *G06F 3/0625* (2013.01); *G06F 3/0659* (2013.01); *G06F 11/08* (2013.01)

(58) Field of Classification Search
CPC ..... G11C 5/148; G06F 3/0625; G06F 3/0659; G06F 11/08
See application file for complete search history.

(56) References Cited

U.S. PATENT DOCUMENTS

| 6,674,684 | B1 * | 1/2004 | Shen ................... G11C 8/12 365/230.02 |
| 7,603,542 | B2 * | 10/2009 | Inuo .................. G06F 15/7867 712/220 |
| 11,169,876 | B2 * | 11/2021 | Ishikawa ............. G06F 11/1068 |

\* cited by examiner

*Primary Examiner* — Pho M Luu
(74) *Attorney, Agent, or Firm* — Holland & Hart LLP

(57) ABSTRACT

Methods, systems, and devices for command triggered power gating for a memory device are described. Row logic circuitry for a memory array may be powered up (on) or powered down (off) independent of at least some other components of a memory device. The row logic circuitry may be on when a bank of the memory array is an active state but may be off when the bank is in a stand-by or power-down state. Additionally or alternatively, error correction circuitry for a memory array may be powered up (on) or powered down (off) independent of at least some other components of a memory device. The error correction circuitry may be on during an access portion of an access sequence but may otherwise be off.

24 Claims, 9 Drawing Sheets

COMMAND TRIGGERED POWER GATING FOR A MEMORY DEVICE

BACKGROUND

The following relates generally to one or more memory systems and more specifically to command triggered power gating for a memory device.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Reducing the amount of power consumption by a memory device may have one or more advantages. For instance, reducing the amount of power consumption may improve battery life for battery-powered devices. One method by which a memory device may reduce power may be for the memory device to activate or deactivate different components within the memory device independently of each other. Deactivating components when they are not in use may enable the memory device to conserve power and, thus, reduce power consumption. To enable independent activation and deactivation, a memory device may include multiple local power domains (LPD), where each LPD provides power for one or more components, and the LPDs may be activated and deactivated independently of one another.

To conserve power, row logic circuitry for a bank of a memory array may be active when the bank is in an active state and otherwise inactive (e.g., when the memory device is in a power-down state, or when the bank is in a stand-by state). For example, an LPD for the row logic circuitry may be turned on (e.g., powered up, activated) response to an activate command for the bank or memory cells thereof (e.g., as opposed to being turned on (active) when the memory device or memory array is in a stand-by state, or additionally or alternatively whenever the memory device or memory array is not in a power-down (e.g., low power) state). The LPD for the row logic circuitry may subsequently be turned off (e.g., powered down, deactivated) in response to a corresponding precharge command for the bank.

Additionally or alternatively, to conserve power, error correction code (ECC) circuitry for a bank of a memory array may be active during a write or read period of a bank and may otherwise be inactive. For example, an LPD for the ECC circuitry may be turned on (e.g., powered up, activated) in response to an access command (e.g., a write command or read command) for the bank or memory cells thereof (e.g., as opposed to being turned on (active) whenever the bank is active, or additionally or alternatively in response to an activate command for the bank or memory cells thereof and thus prior to an access command). The LPD for the ECC circuitry may subsequently be turned off (e.g., powered down, deactivated) in response to a corresponding precharge command for the bank.

Features of the disclosure are initially described in the context of memory systems and dies as described with reference to FIGS. 1-2. Features of the disclosure are described in the context of a low power domain circuit, a memory device architecture, and signaling diagrams as described with reference to FIGS. 3-5B. These and other features of the disclosure are further illustrated by and described with reference to an apparatus diagram and flowcharts that relate to command triggered power gating for a memory device as described with reference to FIGS. 6-9.

Figure 1:
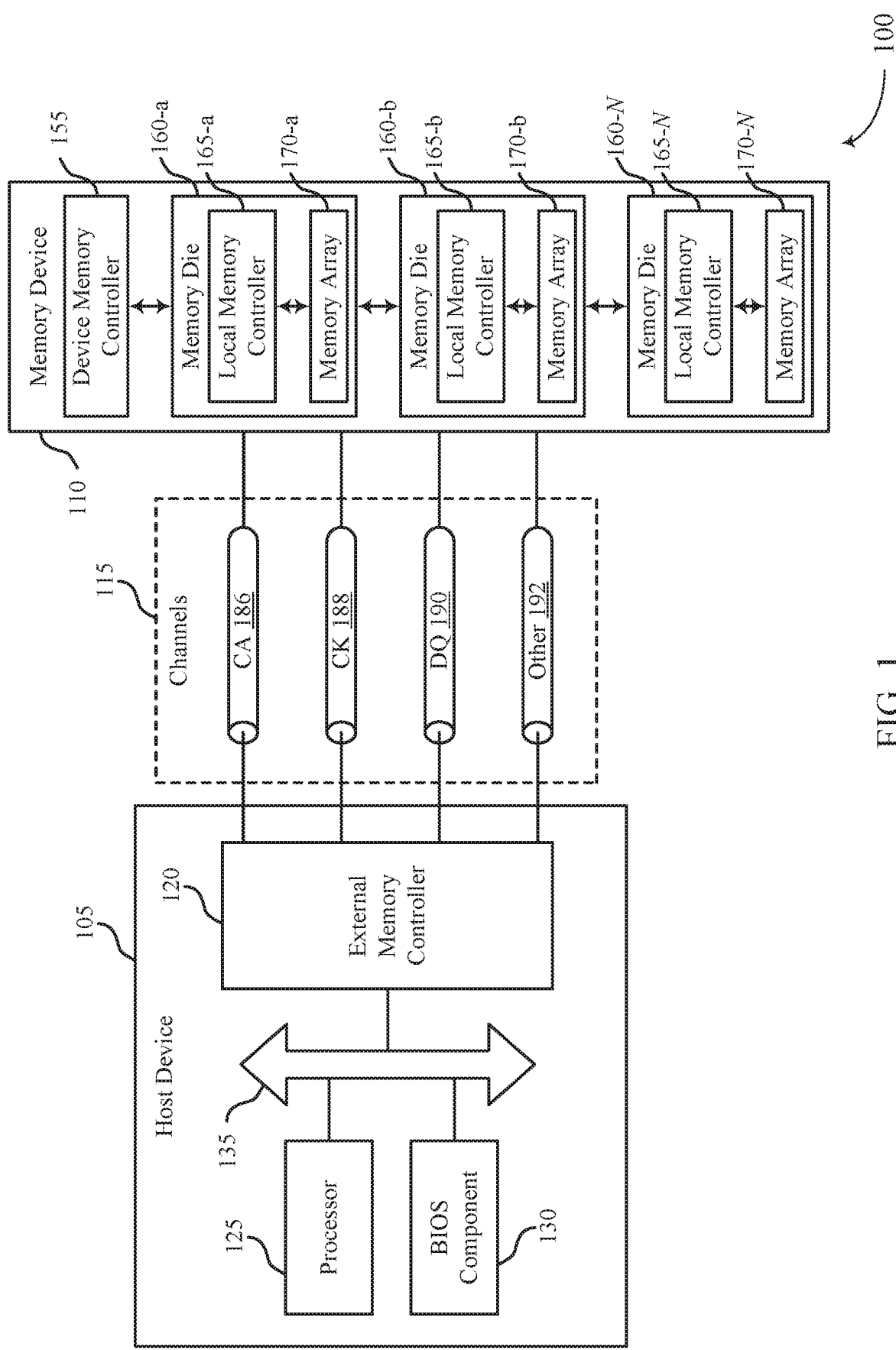
FIG. 1 illustrates an example of a system that supports command triggered power gating for a memory device in accordance with examples as disclosed herein.

FIG. 1 illustrates an example of a system 100 that supports command triggered power gating for a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internee-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-A) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at leak one bit of data. A memory device 110 including two or more memory dies may be referred to as a multi-die memory or a multi-die package or a multi-chip memory or a multi-chip package. In some cases, a memory device 110 may include LPDs that each provide power for a subset (e.g., one or more components) of the memory device and that the memory device 110 may activate or deactivate independently. For instance, the memory device 110 may include a first LPD for ECC circuitry coupled with a memory array 170, a second LPD for row logic circuitry coupled with the memory array 170, a third LPD for column logic circuitry and/or a column select buffer coupled with the memory array 170, and so on.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data.

In some examples, a CA channel 186 may include any quantity of signal paths to decode one or more of address or command data (e.g., eight or nine signal paths).

In some cases, an activate command may be received by the memory device 110 over a CA channel 186. In response to an activate command, the memory device 110 may activate a bank of a memory array 170 and open a row (e.g., activate a word line) within the bank. The bank may be considered to be in an active mode when activated. some cases, a precharge command may be received by the memory device 110 over a CA channel 186. In response to a precharge command, the memory device 110 may close an open row (e.g., deactivate a previously activated word line) and deactivate a bank that includes the closed row. The bank may be considered to be in a stand-by (e.g., idle) mode when deactivated, Between receiving an activate command and a precharge command for a row, an access (e.g., read or write) command may be received by the memory device 110 over a CA channel 186. The memory device may perform a corresponding access operation in response to the access command (e.g., may read data from one or more cells of the open row in response to a read command, may write data to one or more cells of the open row in response to a write command). In some cases, the memory device may receive power-down and power-up (e.g., power-down exit) commands over a CA channel 186 and may transition a memory array 170 or bank thereof into or out of one or more power-down (e.g., low power) modes in response to such power-down and power-up commands. A bank may be considered to be in a power-down mode when the bank or an entity that includes the bank (e.g., a memory 170 or memory device 110) is in a power-down mode.

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

In some examples, the memory device 110 may activate and deactivate LPDs independently of one another (e.g., at different or independently configurable times) to conserve power. For instance, the memory device 110 may activate row logic circuitry for a bank of a memory array 170 when the bank is in an active state and may otherwise keep the row logic circuitry deactivated (e.g., the row logic circuitry may be deactivated when the memory device 110 is in a power-down state, and when the bank is in a stand-by state). For example, the memory device 110 may turn on an LPD for the row logic circuitry in response to receiving an activate command for the bank. The memory device 110 may subsequently turn off the LPD for the row logic circuitry in response to receiving a corresponding precharge command for the bank.

Additionally or alternatively, to conserve power, the memory device 110 may activate ECC circuitry for a bank of a memory array 170 for a write or read period of an access sequence and may otherwise keep the ECC circuitry deactivated. For example, the memory device 110 may turn on an LPD for the ECC circuitry in response to receiving an access command (e.g., a write command or read command) for the bank (e.g., the ECC circuitry may be deactivated when the memory device 110 is in a power-down state, when the bank is in a stand-by state, and may only duration a portion of a time that the bank is in an active state). The memory device 110 may subsequently turn off the LPD for the ECC circuitry in response to receiving a corresponding precharge command for the bank.

Figure 2:
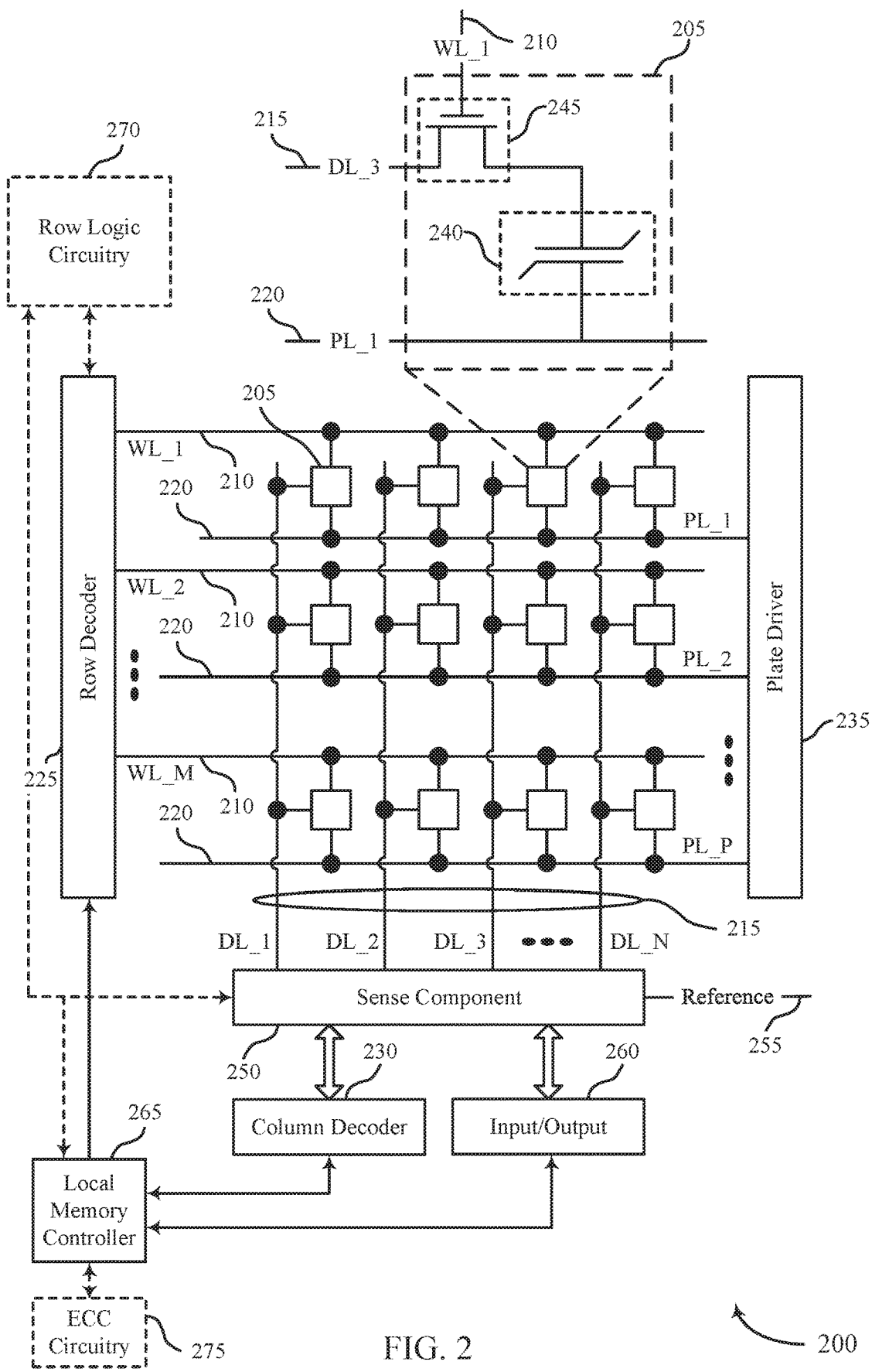
FIG. 2 illustrates an example of a memory die that supports command triggered power gating for a memory device in accordance with examples as disclosed herein.

FIG. 2 illustrates an example of a memory die 200 that supports command triggered power gating for a memory device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1. Although aspects of the techniques disclosed herein may be described with reference to examples in the context of an FeRAM memory die, it should be noted that some or each of the techniques may also be applied to other types of memory or memory dies (e.g., DRAM memory dies).

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation.

Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255

(e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired logic state. The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The local memory controller 265 may apply a specific signal (e.g., write pulse) to the digit line 215 during the write operation to store a specific state (e.g., charge) in the capacitor 240 of the memory cell 205. The pulse used as part of the write operation may include one or more voltage levels over a duration.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255. Based on that comparison, the sense component 250 may determine a logic state that is stored on the memory cell 205.

In some examples, the memory die 200 may include row logic circuitry 270. The row logic circuitry 270 may, for example, include control circuitry and generate control signals for aspects of the memory die 200 related to operating one or more rows of memory cells 205. In some examples, the row logic circuitry 270 may be coupled with or included in local memory controller 265. In some examples, the row logic circuitry 270 may be coupled with row decoder 225. In such cases, row logic circuitry 270 may include one or more word line drivers couplable with one or more word lines 210 of the memory die 200 via the row decoder 225. The row logic circuitry 270 may be configured to control word line drivers to cause the drivers to activate or deactivate the one or more word lines 210. Additionally or alternatively, the row logic circuitry may be coupled with sense component 230. In such cases, row logic circuitry 270 may include control logic coupled with one or more sense amplifiers of the sense component 230. The row logic circuitry 270 may be configured to activate or deactivate the one or more sense amplifiers or generate timing signals that control operation of the one or more sense amplifiers. In some examples, the row logic circuitry 270 may be active when a bank of the memory array is in an active state and otherwise inactive (e.g., when the memory device is in a power-down state, or when the bank is in a stand-by state). For example, an LPD for the row logic circuitry 270 may be turned on in response to an activate command for the bank. The LPD for the row logic circuitry 270 may subsequently be turned off in response to a corresponding precharge command for the bank.

In some examples, the memory die 200 may include ECC circuitry 275. In some examples, the ECC circuitry 275 may be coupled with or included in local memory controller 265. The ECC circuitry 275 may be coupled with a memory array of the memory die 200 (e.g., via local memory controller 265). If the local memory controller 265 receives a write command, the FCC circuitry 275 may be configured to generate an ECC for a set of data that the write command indicates to store in the memory array. In such cases, the generated ECC may be stored in the memory array. Alternatively, if the local memory controller 265 receives a read command, the ECC circuitry 275 may be configured to perform an error correction procedure using an ECC retrieved from the memory array and associated with a set of data that the read command indicates to retrieve from the memory array. As used herein, error correction may broadly refer to error detection or error correction. The ECC circuitry 275 may generate a second set of data based on the retrieved set of data and the retrieved ECC. In such cases, the memory die 200 may transmit the second set of data. In some examples, the ECC circuitry 275 may be active during a write or read period of a bank of the memory array and may otherwise be inactive. For example, an LPD for the ECC circuitry 275 may be turned on in response to an access command (e.g., a write command or read command) for the bank. The LPD for the ECC circuitry may subsequently be turned off in response to a corresponding precharge command for the bank.

Figure 3:
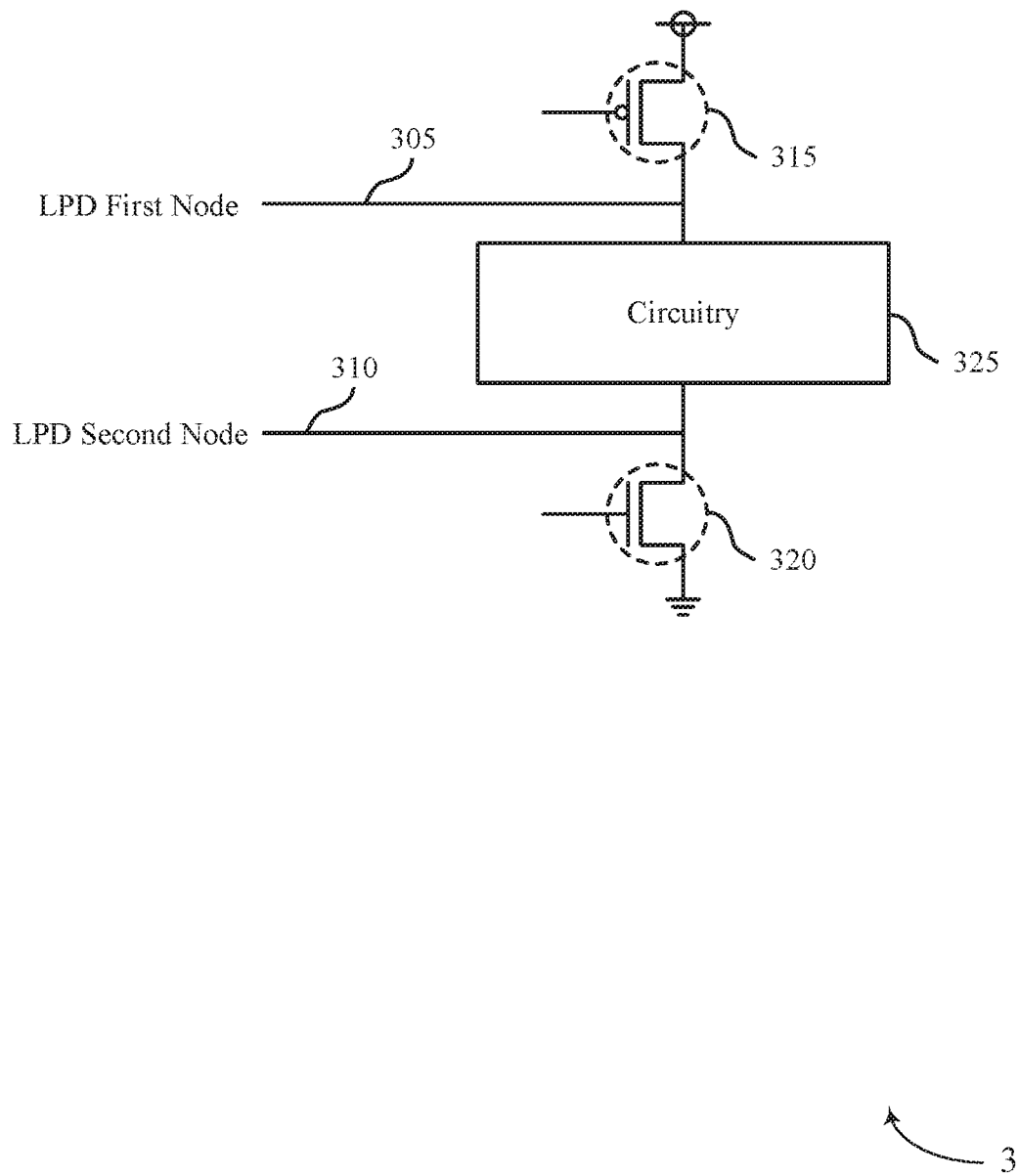
FIG. 3 illustrates an example of a low power domain circuit that supports command triggered power gating for a memory device in accordance with examples as disclosed herein.

FIG. 3 illustrates an example of an LPD circuit 300 that supports command triggered power gating for a memory device in accordance with examples as disclosed herein. It should be noted that the examples and techniques described herein may be applied for one or more types of memory arrays (e.g., FeRAM memory arrays, DRAM memory arrays). LPD circuit 300 may be a circuit configured to support power to and selectively activate or deactivate one or more components within a memory device independently of other components of the memory device via a technique referred to as power gating. Components that are powered by and selective activated or deactivated using the same LPD circuit 300 may be referred to as an LPD or as being within an LPD. Power gating may involve the LPD circuit 300 selectively shutting off current to the one or more components. In one example, a first LPD circuit 300 may be used to activate or deactivate row logic circuitry (e.g., row logic circuitry 270 as described with reference to FIG. 2), a second LPD circuit 300 may be used to activate or deactivate ECC circuitry (e.g., ECC circuitry 275 as described with reference to FIG. 2), and a third LPD circuit 300 may be used to activate or deactivate column logic circuitry and/or a column select buffer.

LPD circuit 300 may include a first node 305 and a second node 310. The first node 305 may be coupled with a first power gating switch 315 and circuitry 325. The first power gating switch 315 may include one or more transistors (e.g., one or more positive channel metal-oxide semiconductor (PHOS) transistors) and may be coupled with a voltage supply. The second node 310 may be coupled with a second power gating switch 320 and circuitry 325. The second power gating switch 320 may include one or more transistors (e.g., one or more negative channel metal-oxide semiconductor (NMOS) transistors) and may be coupled with a ground. The circuitry 325 may include be any circuitry configured to be coupled with and powered by the first node 305 and the second 310. The circuitry 325 may represent one or more components of a memory device 110 within an LPD corresponding to the LPD circuit 300.

In some examples, LPD circuit 300 may be operated to switch from the circuitry 325 being activated (e.g., in an active or ON state, which may be referred to as the LPD being on) to the circuitry 325 being deactivated (e.g., in an inactive or OFF state, which may be referred to as the LPD being off) or vice-versa. When circuitry 325 is in an active state (activated), first power gating switch 315 may be activated (e.g., ON, conductive), which may supply the first node 305 with a voltage based on the voltage supply (e.g., positive supply) coupled with the first power gating switch 315. Additionally, second power gating switch 320 may be activated, which may supply the second node 310 with a voltage based on the voltage supply (e.g., ground or negative supply) coupled with the second power gating switch 320. Providing these voltages to the first node 305 and the second node 310 may configure the circuitry 325 to be powered on and in an active state. When circuitry 325 is in an inactive state (deactivated), one or more of first power gating switch 315 or second power gating switch 320 may be deactivated (e.g., OFF, non-conductive), thus isolating the circuitry 325 from one or more of the voltage supply coupled with the first power gating switch 315 or the voltage supply coupled with the second power gating switch 320.

The timing with which an LPD circuit 300 is operated to switch from circuitry 325 being active to circuitry 325 being inactive or vice-versa may depend on a function of the circuitry 325. For instance, if the circuitry 325 is row logic circuitry (e.g., row logic circuitry 270 as described with reference to FIG. 2), the LPD circuit 300 may be operated to activate the circuitry 325 when a bank of a memory array switches from a stand-by state to an active state and otherwise to maintain the circuitry 235 in an inactive (deactivated) state. However, if the circuitry 325 is FCC circuitry (e.g., ECC circuitry 275 as described with reference to FIG. 2), the LPD circuit 300 may be operated to activate the circuitry 325 during a read or write period of an access sequence and otherwise to maintain the circuitry 235 in an inactive (deactivated) state.

Switching off power gating switch 315 and power gating switch 320 in order to place the circuitry 325 into an inactive mode may have one or more advantages. For instance, the power gating switch 315 and power gating switch 320 may have lower leakage when in an OFF state compared to transistors or other components of circuitry 325. In some cases, the power gating switch 315 and power gating switch 320 may be physically larger (e.g., thicker gate oxides) or have higher threshold voltages compared to transistors or other components of circuitry 325 Thus, by isolating the first node 305 and the second node 310 from corresponding power supplies, the power gating switch 315 and the power gating switch 320 may mitigate an amount of current that the circuitry 325 might otherwise leak.

Figure 4:
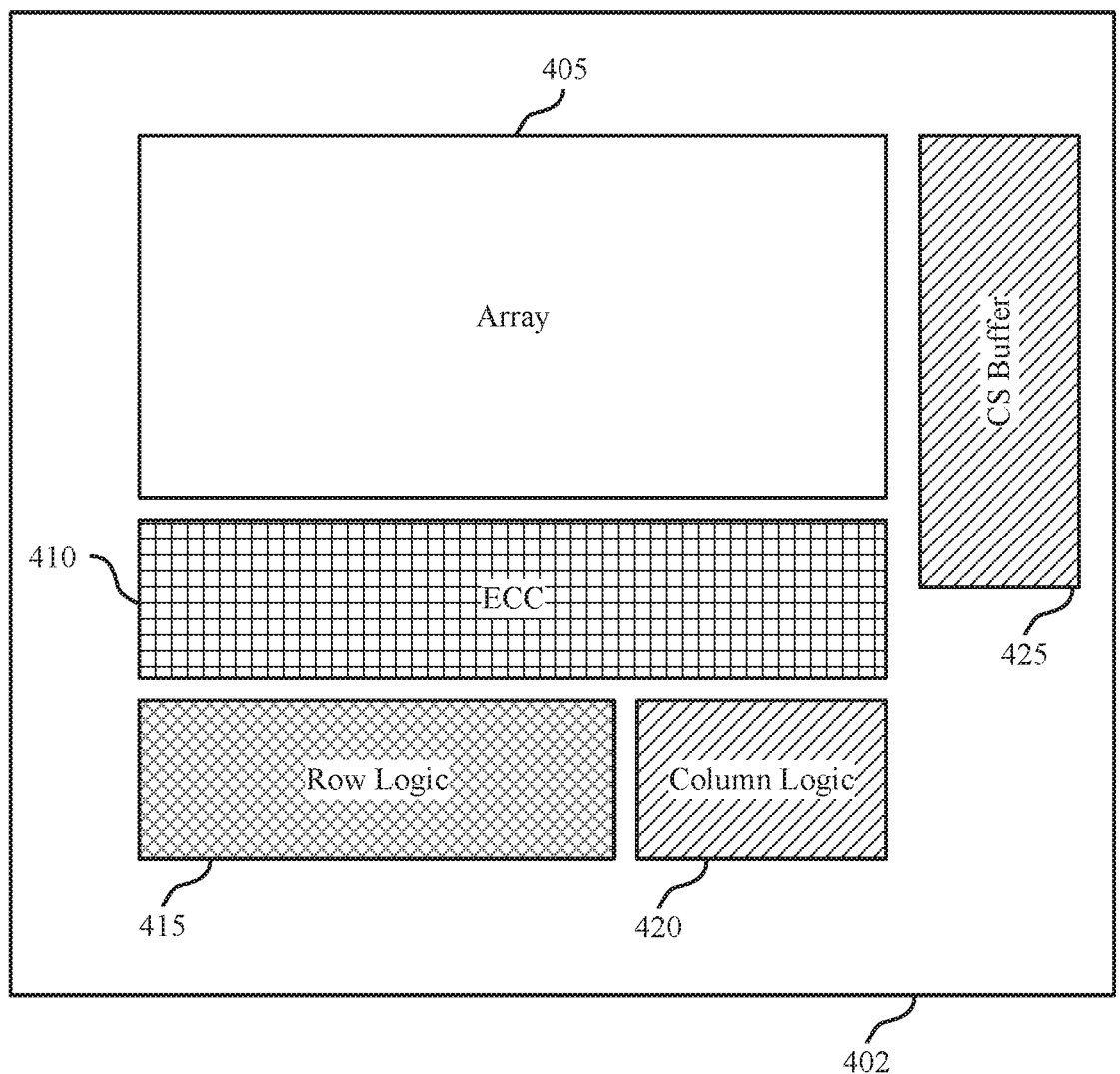
FIG. 4 illustrates an example of a memory device architecture that supports command triggered power gating for a memory device in accordance with examples as disclosed herein.

FIG. 4 illustrates an example of a memory device architecture 400 that supports command triggered power gating for a memory device in accordance with examples as disclosed herein. It should be noted that the examples and techniques described herein may be applied for one or more types of memory arrays (e.g., FeRAM memory arrays, DRAM memory arrays). Memory device architecture 400 may represent one or more components of a memory die 402 (which may be an example of a memory die 160 or a memory die 200). Memory array 405 may be an example of a memory array 170 as described with reference to FIG. 1 or of a memory array as describe with reference to FIG. 2. Row logic component 415 may be an example of row logic circuitry 270 as described with reference to FIG. 2 and ECC component 410 may be an example of ECC circuitry 275 as described with reference to FIG. 2.

Memory device architecture 400 may include a memory array 405. Memory array 405 may include memory cells (e.g., memory cells 205) coupled with respective row lines (e.g., word lines 210) and respective column lines (e.g., digit lines 215). Memory array 405 may be operable to store data (e.g., if the memory device including memory array 405 receives a write command) or to retrieve data (e.g., if the memory device including memory array 405 receives a read command).

Memory device architecture 400 may include an ECC component 410, which may be an example of aspects of ECC circuitry 275 as described with reference to FIG. 2. The ECC component 410 may be coupled with memory array 405. When the memory device including the memory array 405 receives a write command, the ECC component 410 may be configured to generate an ECC for a set of data that the write command indicates to store in the memory array 405. In such cases, the generated ECC may be stored in the memory array 405. Alternatively, if memory device including the memory array 405 receives a read command, the ECC component 410 may be configured to perform an error correction procedure using an ECC retrieved from the memory array 405. The retrieved ECC may be associated with a first set of data that the read command indicates to retrieve from the memory array 405. The ECC component 410 may generate a second set of data based on the retrieved set of data and the retrieved ECC. In such cases, the memory device may transmit the second set of data to a host device 105).

Memory device architecture 400 may include row logic component 415, which may be an example of aspects of row logic circuitry 270 as described with reference to FIG. 2. Row logic component 415 may be coupled with the memory array 405. Row logic component 415 may include or be configured to control the operation of one or more row line drivers (e.g., word line drivers) couplable with one or more row lines of the memory array 405. The row line drivers may be configured to activate or deactivate the one or more row lines via the row line drivers. Additionally or alternatively, the row logic component 415 may include control logic coupled with one or more sense amplifiers for the memory array 405. In such cases, the row logic component 415 may be configured to activate or deactivate or otherwise control the one or more sense amplifiers.

Memory device architecture 400 may include column logic component 420 and a column select buffer 425. The column logic component 420 and the column select buffer 425 may be coupled with the memory array 405.

In some examples, a memory device including memory array 405 may support one or more power-down modes (modes may alternatively be referred to as states). When operating in a power-down mode, some or all LPDs within the memory device may be deactivated. When not in a power-down mode, the memory array 405 or a bank of the memory array 405 may operate in an active state or in a stand-by state (which may alternatively be referred to as an idle state). Different LPDs associated with the bank may be active or inactive in various combinations depending on whether the bank is in the active state or the stand-by state. In some cases, a bank may be switched into an active state in response to an activate command for the bank or memory cells therein, and the bank may be switched into a stand-by state in response to a precharge command for the bank or memory cells thereof, so long as the bank or the memory array 405 is not in a power-down mode.

In some examples, one or more components of memory device architecture may be independently activated or deactivated using LPDs (e.g., as described with reference to FIG. 3). For instance, the column logic component 420 and the column select buffer 425 may be within a first LPD 430; the row logic component 415 may be within a second LPD 435; and the ECC component 410 may be within a third LPD 440. Accordingly, the ECC component 410 and the row logic component 415 may each be activated or deactivated independently of each other and also independently of the column logic component 420 and the column select buffer 425.

In some examples, the column logic component 420 and the column select buffer may be active when a bank of the memory array 405 is in an active state and may be otherwise inactive (e.g., may be inactive when the memory device including the memory array 405 is in a power-down state, or when the bank is in a stand-by state). Accordingly, the first LPD 430 may be turned on in response to an activate command for the bank and may subsequently be turned off in response to a corresponding precharge command for the bank.

In some examples, the row logic component 415 may be active when a bank of the memory array is in an active state and may otherwise be inactive (e.g., may be inactive when the memory device including the memory array 405 is in a power-down state, or when the bank is in a stand-by state). Accordingly the second LPD 435 may be turned on in response to an activate command for the bank and may subsequently be turned off in response to a corresponding precharge command for the bank.

In some examples, the ECC component 410 may be active during a write or read period of an access sequence for a bank of the memory array 405 (e.g., a subset of a time period during which the bank of the memory array 405 is in an active state) and may otherwise be inactive. For example, the third LPD 440 for the ECC circuitry 275 may be turned on in response to an access command (e.g., a write command or read command) for the bank. The third LPD 440 for the ECC circuitry may subsequently be turned off in response to a corresponding precharge command for the bank.

Figure 5A:
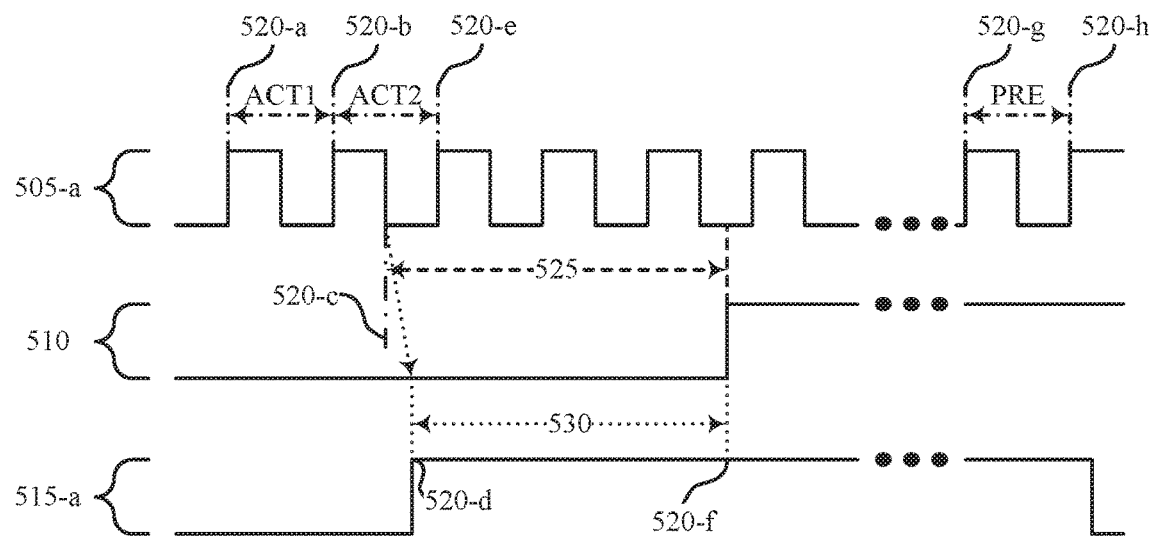
FIGS. 5A and 5B illustrate examples of signaling diagrams that support command triggered power gating for a memory device in accordance with examples as disclosed herein.
Figure 5B:
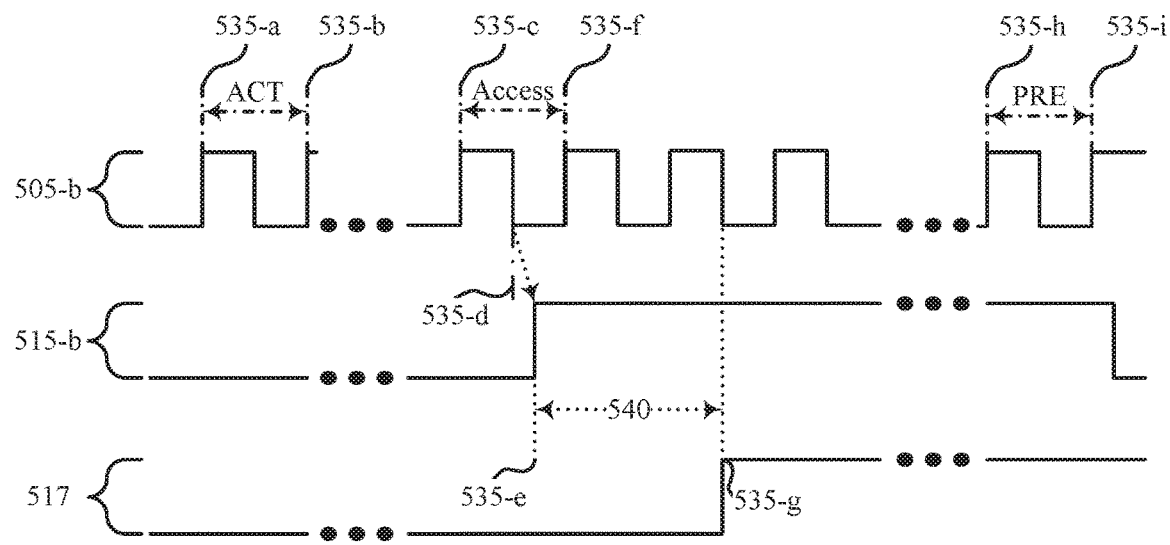

FIGS. 5A and 5B illustrate example of signaling diagrams 500-a and 500-b that supports command triggered power gating for a memory device in accordance with examples as disclosed herein. It should be noted that the examples and techniques described herein may be applied for one or more types of memory arrays (e.g., FeRAM memory arrays, DRAM memory arrays). Signaling diagram 500-a may depict signaling associated with when row logic component 415 is activated and subsequently deactivated. Similarly, signaling diagram 500-b may depict signaling associated with when ECC component 410 is activated and subsequently deactivated.

FIG. 5A depicts clock signaling 505-a, bank signaling 510, and LPD signaling 515-a. Clock signaling 505-a may be an example of CK signaling 188 as described with reference to FIG. 1. Bank signaling 510 may represent signaling that indicates a state of a bank of the memory array 405. For instance, before time 520-f the bank signaling 510 may have a low value indicating that the bank is in a stand-by state. After time 520-f, the bank signaling 510 may have a high value indicating that the bank is in an active state. LPD signaling 515-a may represent signaling that indicates a state of the second LPD 435. For instance, before time 520-d, the LPD signaling 515-a may have a low value indicating that an LPD circuit (e.g., LPD circuit 300) of the second LPD 435 is shutting off current from the row logic component 415 (e.g., and thus the row logic component 415 is to be activated). At time 520-f, the LPD signaling 515 may have a high value indicating that the LPD circuit of the second LPD 435 is providing current to the row logic component 415 (e.g., and thus the row logic component 415 is to be deactivated).

In between time 520-a and 520-b (e.g., one clock cycle), a memory device including memory array 405 may receive a first activate command. In between time 520-b and 520-e (e.g., one clock cycle), the memory device may receive a second activate command. In some cases, the first activate command may include a first portion of an address for one or more memory cells (e.g., for a row of memory cells), and the second activate command may include a second portion of the address. The interval between time 520-c and 520-d may represent a latency from a falling edge of the clock signaling 505-*a* to a time when the LPD signaling 515-*a* switches from the low value to the high value.

After the second activate command is received, the bank may switch from a stand-by state to an active state. This may occur during a bank active latency interval 525, which may span from time 520-*c* to time 520-*f*. Accordingly, for row logic component 415 to be activated before 520-*f*, the row logic component 415 may be activated within LPD wake-up margin 530, and thus at any time after time 520-*d* and before time 520-*f*. At time 520-*f*, the bank signaling 510 may switch from a low value to a high value.

In between time 520-*g* and time 520-*h* (e.g., one clock cycle), the memory device may receive a precharge command. After receiving the precharge command (e.g., with some delay relative thereto), the LPD signaling 515-*a* may switch from a high value to a low value. Accordingly, after the LPD signaling 515-*a* switches from the high value to the low value, the row logic component 415 may be deactivated.

By activating and deactivating the row logic component 415 in this manner, the memory device may conserve power. For instance, the total duration that the row logic component 415 is activated as disclosed herein may be less than in some devices, such as some devices in which the row logic component 415 is deactivated only during a power-down mode. The row logic component 415 may consume less power in a deactivated state. Accordingly, the row logic component 415 may consume less power according to the methods as described herein.

FIG. 5B depicts clock signaling 505-*b*, LPD signaling 515-*b*, and internal signaling 517 (e.g., column redundancy signaling). Clock signaling 505-*b* may be an example of CK signaling 188 as described with reference to FIG. 1. LPD signaling 515-*b* may represent signaling that indicates a state of the third LPD 440. For instance, before time 535-*e*, the LPD signaling 515-*b* may have a low value indicating that an LPD circuit (e.g., LPD circuit 300) of the third LPD 440 is shutting off current from the ECC component 410 (e.g., and thus the ECC component 410 is to be activated). At time 535-*g*, the LPD signaling 515-*b* may have a high value indicating that the LPD circuit of the third. LPD 440 is providing current to the ECC component 410 (e.g., and thus the ECC component 410 is to be deactivated). Internal signaling 517 may represent signaling that indicates whether a bank of the memory array 405 is within a read or write period. For instance, before time 535-*g*, the internal signaling 517 may have a low value that indicates that the bank is not within a read or write period. After time 535-*g*, the internal signaling 517 may have a high value that indicate that the bank is within the read or write period.

In between time 535-*a* and 535-*b* (e.g., one clock cycle), a memory device including memory array 405 may receive an activate command. At a later time, in between time 535-*c* and 535-*f* (e.g., one clock cycle), the memory device may receive an access command (e.g., a read command or a write command). In between time 535-*b* and time 535-*c*, column logic component 420 and column select buffer 425 may be activated. Additionally, in response to the activate command (e.g., in between time 535-*b* and time 535-*c*), the bank of the memory array 405 may switch from a stand-by state to an active state. The interval between time 535-*d* and 535-*e* may represent a latency from a falling edge of the clock signaling SOS to a time when the LPD signaling 515-*b* switches from the low value to the high value.

After the access command is received, the bank may prepare for an access (e.g., read or write) period over an interval that spans from time 535-*f* to time 535-*g*. Accordingly, for ECC component 410 to be activated before 535-*g*, the ECC component 410 may be activated within LPD wake-up margin 540, and thus at any time after 535-*e* and before time 535-*g*. At time 535-*g*, the internal signaling 517 may switch from a low value to a high value.

In between time 535-*h* and time 535-*i* (e.g., one clock cycle), the memory device may receive a precharge command. After receiving the precharge command (e.g., with some delay relative thereto), the LPD signaling 515-*b* may switch from a high value to a low value. Accordingly, after the LPD signaling 515-*b* switches from the high value to the low value, the ECC component 410 may be deactivated.

By activating and deactivating the ECC component 410 in this manner, the memory device may conserve power. For instance, the total duration that the ECC component 410 is activated as disclosed herein may be less than in some devices, such as some devices in which the ECC component 410 may be activated in response to the activation command (e.g., between time 535-*a* and time 535-*b*), and thus at an earlier time than when activated in response to the access command. The ECC component 410 may consume less power in a deactivated state. Accordingly, the ECC component 410 may consume less power according to the methods as described herein.

Figure 6:
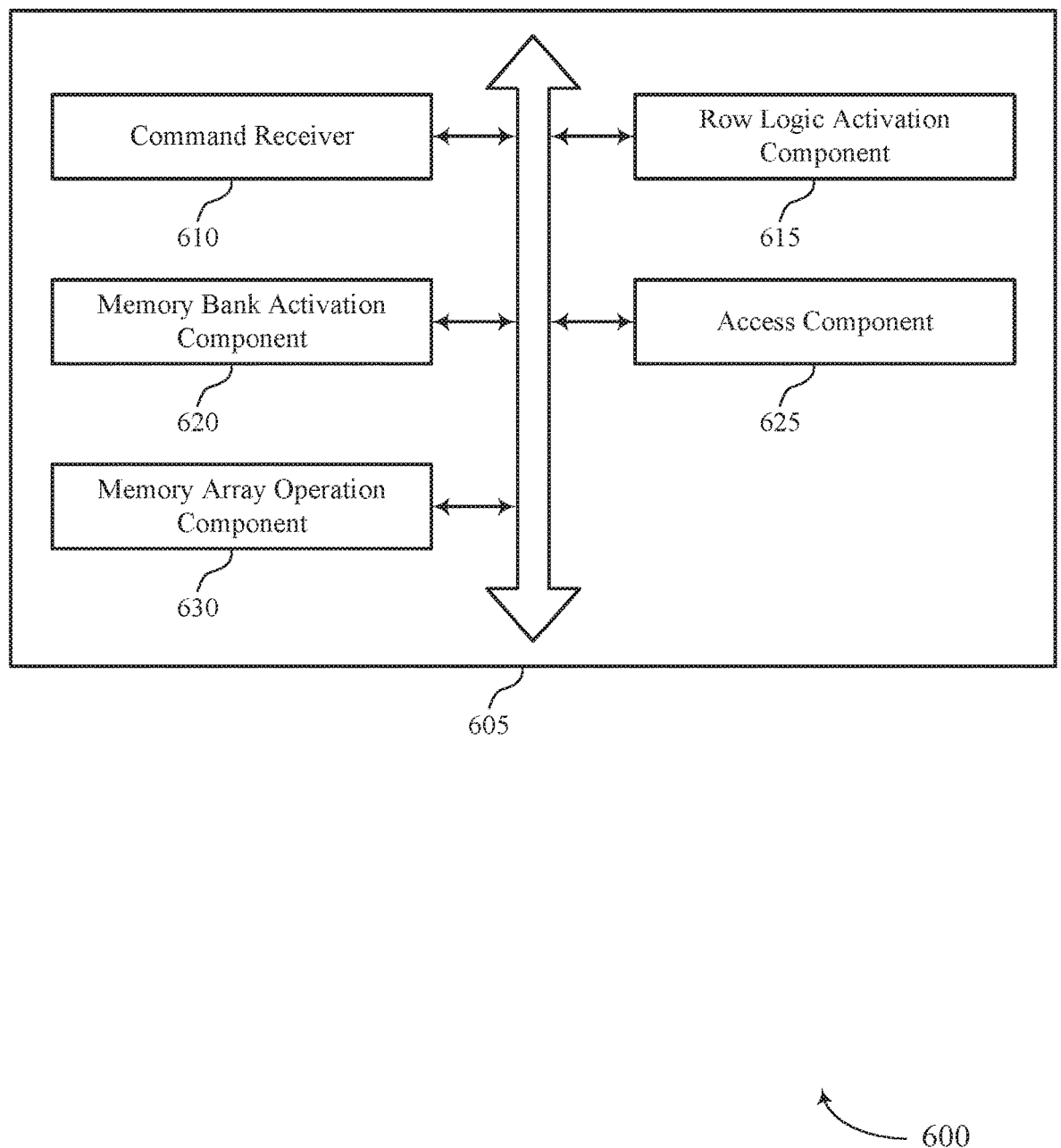
FIG. 6 shows a block diagram of a memory device that supports command triggered power gating for a memory device in accordance with examples as disclosed herein.

FIG. 6 shows a block diagram 600 of a memory device 605 that supports command triggered power gating for a memory device in accordance with examples as disclosed herein. The memory device 605 may be an example of aspects of a memory device as described with reference to FIGS. 1 through 5B. The memory device 605 may include a command receiver 610, a row logic activation component 615, a memory bank activation component 620, an access component 625, and a memory array operation component 630. Each of these modules may communicate, directly or indirectly, with one another (e.g., via one or more buses).

The command receiver 610 may receive an activate command at a memory device that includes a memory array. In some examples, the command receiver 610 may receive a second activate command prior to the activate command. In some examples, the command receiver 610 may receive a precharge command at the memory device.

The row logic activation component 615 may activate, in response to receiving the activate command, row logic circuitry coupled with the memory array. In some examples, the row logic activation component 615 may deactivate, in response to receiving the precharge command, the row logic circuitry. In some examples, the row logic circuitry is activated in response to receiving the activate command and the second activate command. In some cases, the row logic circuitry is activated based on a latency relative to an edge of a clock signal, where the edge is concurrent with the activate command being received. In some cases, the edge is a falling edge of the clock signal.

The memory bank activation component 620 may activate, in response to receiving the activate command, a bank of the memory array after activating the row logic circuitry.

The access component 625 may perform, after activating the bank and the row logic circuitry, an access operation for one or more memory cells within the bank.

In some examples, the memory array operation component 630 may operate the memory array in a stand-by mode prior to receiving the activate command, where the row logic circuitry is deactivated when the memory array is in the stand-by mode, and where the row logic circuitry is deactivated when the memory device receives the activate command.

In some examples, the memory array operation component 630 may operate the memory array in a power-down mode prior to receiving the activate command, where the row logic circuitry is deactivated when the memory array is in the power-down mode, and where the row logic circuitry is deactivated when the memory device receives the activate command.

Figure 7:
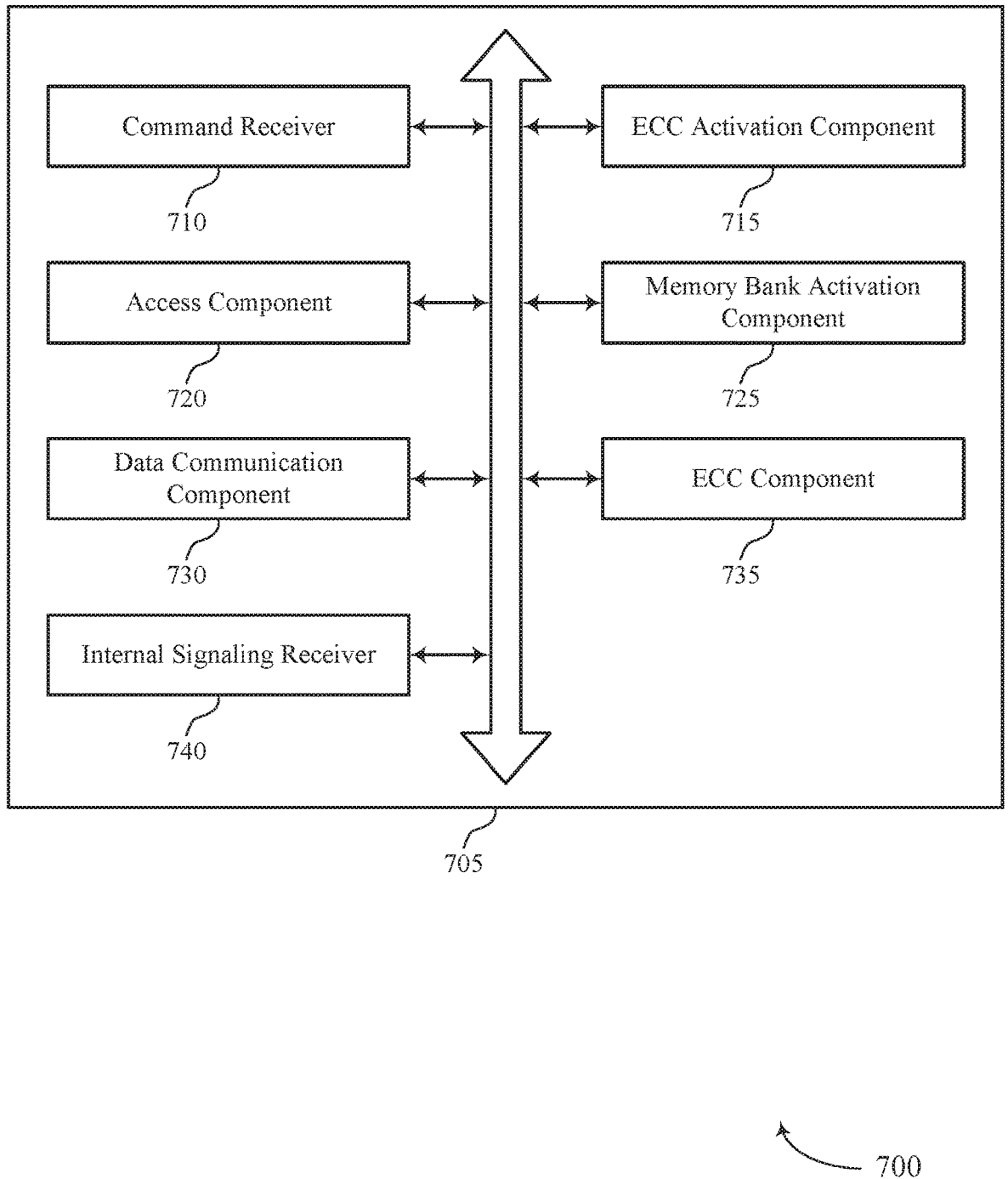
FIG. 7 shows a block diagram of a memory device that supports command triggered power gating for a memory device in accordance with examples as disclosed herein.

FIG. 7 shows a block diagram 700 of a memory device 705 that supports command triggered power gating for a memory device in accordance with examples as disclosed herein. The memory device 705 may be an example of aspects of a memory device as described with reference to FIGS. 1 through 5B. The memory device 705 may include a command receiver 710, an ECC activation component 715, an access component 720, a memory bank activation component 725, a data communication component 730, an ECC component 735, and an internal signaling receiver 740. Each of these modules may communicate, directly or indirectly, with one another (e.g., via one or more buses).

The command receiver 710 may receive an activate command at a memory device that includes a memory array. In some examples, the command receiver 710 may receive an access command at the memory device after receiving the activate command. The access command may be a write command or a read command. In some examples, the command receiver 710 may receive a precharge command at the memory device.

The ECC activation component 715 may activate, in response to receiving the access command, error correction code circuitry coupled with the memory array. In some examples, the ECC activation component 715 may deactivate, in response to receiving the precharge command, the error correction code circuitry. In some cases, the error correction code circuitry is activated based on a latency relative to an edge of a clock signal, and where the edge is concurrent with the access command being received. In some cases, the edge is a falling edge of the clock signal.

The access component 720 may access one or more memory cells within a bank of the memory array based on activating the error correction code circuitry. In some examples, the access component 720 may store a set of data at one or more additional memory cells of the memory array. In some examples, the access component 720 may retrieve a first set of data associated with the read command from one or more additional memory cells of the memory array. In some examples, the access component 720 may retrieve an error correction code for the first set of data from the memory array, where accessing the one or more memory cells involves retrieving the error correction code from the one or more memory cells.

The memory bank activation component 725 may activate, in response to receiving the activate command and before receiving the access command, the bank of the memory array.

The data communication component 730 may receive a set of data associated with the write command. In some examples, the data communication component 730 may transmit a second set of data (e.g., generated by ECC component 735).

The ECC component 735 may generate, by the error correction code circuitry, an error correction code for the set of data, where accessing the one or more memory cells includes storing the error correction code at the one or more memory cells. In some examples, the ECC component 735 may perform, using the error correction code, an error correction procedure for the first set of data based on the retrieved error correction code to generate the second set of data.

The internal signaling receiver 740 may receive internal signaling corresponding to the access command at the error correction code circuitry after activating the error correction code circuitry and before accessing the one or more memory cells within the bank of the memory array. In some cases, the internal signaling includes column redundancy signaling.

In some examples, a memory device as described herein may include one or more components of a memory device 605 and one or more components of a memory device 705, in any combination.

Figure 8:
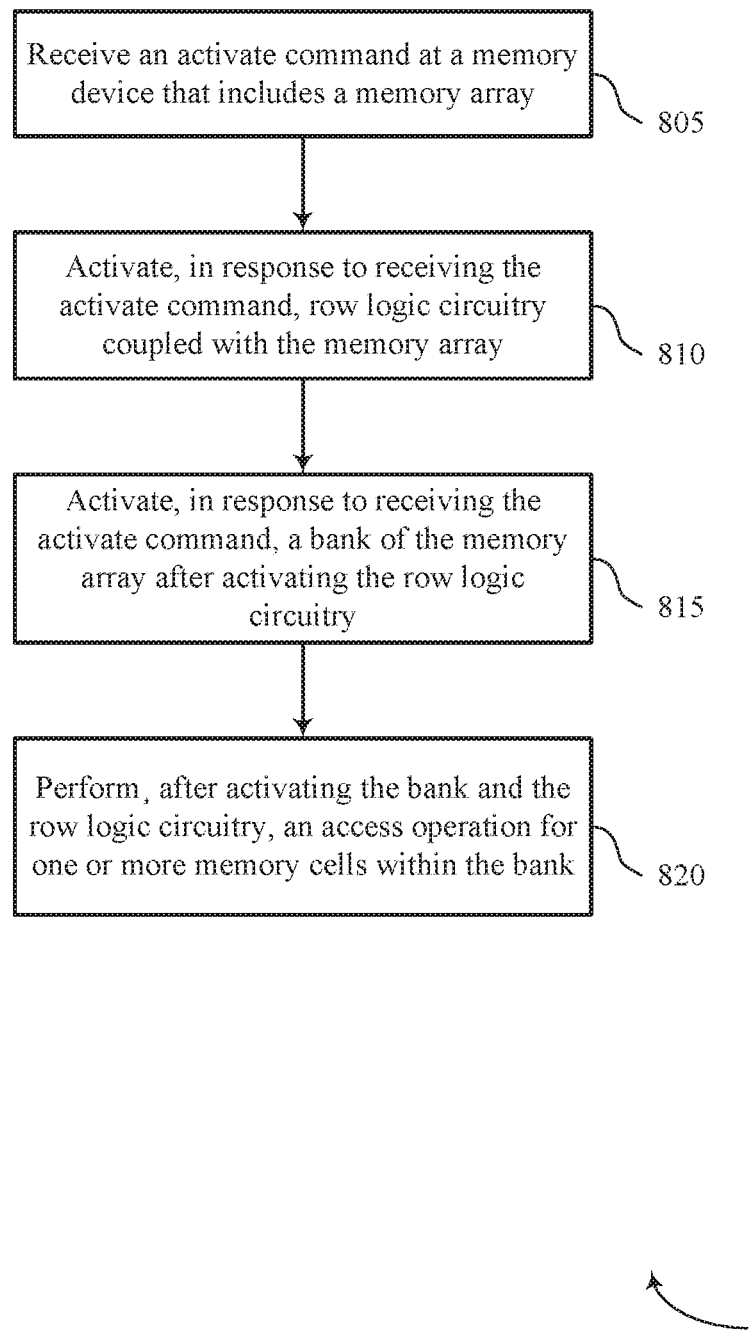
FIGS. 8 and 9 show flowcharts illustrating a method or methods that support command triggered power gating for a memory device in accordance with examples as disclosed herein.

FIG. 8 shows a flowchart illustrating a method or methods 800 that supports command triggered power gating for a memory device in accordance with examples as disclosed herein. The operations of method 800 may be implemented by a memory device or its components as described herein. For example, the operations of method 800 may be performed by a memory device as described with reference to FIG. 6. In some examples, a memory controller may execute a set of instructions to control the functional elements of the memory device to perform the described functions. Additionally or alternatively, a memory controller may cause a memory device to perform aspects of the described functions using special-purpose hardware.

At 805, the memory device may receive an activate command. The memory device may include a memory array. The operations of 805 may be performed according to the methods described herein. In some examples, aspects of the operations of 805 may be performed by a command receiver as described with reference to FIG. 6.

At 810, the memory device may activate, in response to receiving the activate command, row logic circuitry coupled with the memory array. The operations of 810 may be performed according to the methods described herein. In some examples, aspects of the operations of 810 may be performed by a row logic activation component as described with reference to FIG. 6.

At 815, the memory device may activate, in response to receiving the activate command, a bank of the memory array after activating the row logic circuitry. The operations of 815 may be performed according to the methods described herein. In some examples, aspects of the operations of 815 may be performed by a memory bank activation component as described with reference to FIG. 6.

At 820, the memory device may perform, after activating the bank and the row logic circuitry, an access operation for one or more memory cells within the bank. The operations of 820 may be performed according to the methods described herein. In some examples, aspects of the operations of 820 may be performed by an access component as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for receiving an activate command at a memory device that includes a memory array, activating, in response to receiving the activate command, row logic circuitry coupled with the memory array, activating, in response to receiving the activate command, a bank of the memory array after activating the row logic circuitry, and performing, after activating the bank and the row logic circuitry, an access operation for one or more memory cells within the bank.

In some examples of the method 800 and the apparatus described herein, the row logic circuitry may be activated based on a latency relative to an edge of a clock signal, where the edge may be concurrent with the activate command being received.

In some examples of the method 800 and the apparatus described herein, the edge may be a falling edge of the clock signal.

Some examples of the method 800 and the apparatus described herein may further include operations, features, means, or instructions for receiving a second activate command prior to the activate command, where the row logic circuitry may be activated in response to receiving the activate command and the second activate command.

Some examples of the method 800 and the apparatus described herein may further include operations, features, means, or instructions for receiving a precharge command at the memory device, and deactivating, in response to receiving the precharge command, the row logic circuitry.

Some examples of the method 800 and the apparatus described herein may further include operations, features, means, or instructions for operating the memory array in a stand-by mode prior to receiving the activate command, where the row logic circuitry may be deactivated when the memory array is in the stand-by mode, and where the row logic circuitry may be deactivated when the memory device receives the activate command.

Some examples of the method 800 and the apparatus described herein may further include operations, features, means, or instructions for operating the memory array in a power-down mode prior to receiving the activate command, where the row logic circuitry may be deactivated when the memory array is in the power-down mode, and where the row logic circuitry may be deactivated when the memory device receives the activate command.

Figure 9:
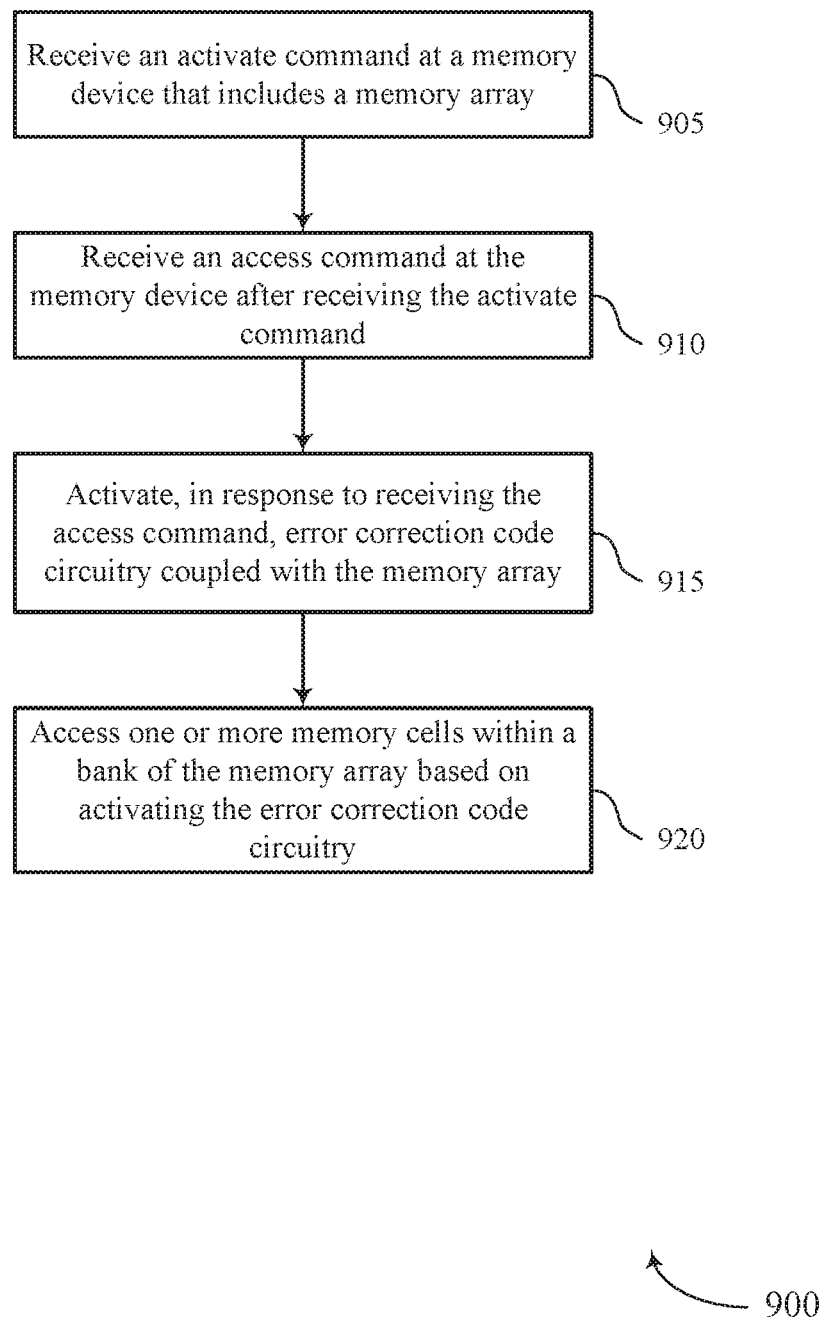

FIG. 9 shows a flowchart illustrating a method or methods 900 that supports command triggered power gating for a memory device in accordance with examples as disclosed herein. The operations of method 900 may be implemented by a memory device or its components as described herein. For example, the operations of method 900 may be performed by a memory device as described with reference to FIG. 7. In some examples, a memory controller may execute a set of instructions to control the functional elements of the memory device to perform the described functions. Additionally or alternatively, a memory controller may cause a memory device to perform aspects of the described functions using special-purpose hardware.

At 905, the memory device may receive an activate command. The memory device may include a memory array. The operations of 905 may be performed according to the methods described herein. In some examples, aspects of the operations of 905 may be performed by a command receiver as described with reference to FIG. 7.

At 910, the memory device may receive an access command after receiving the activate command. The operations of 910 may be performed according to the methods described herein. In some examples, aspects of the operations of 910 may be performed by a command receiver as described with reference to FIG. 7.

At 915, the memory device may activate, in response to receiving the access command, error correction code circuitry coupled with the memory array. The operations of 915 may be performed according to the methods described herein. In some examples, aspects of the operations of 915 may be performed by an ECC activation component as described with reference to FIG. 7.

At 920, the memory device may access one or more memory cells within a bank of the memory array based on activating the error correction code circuitry. The operations of 920 may be performed according to the methods described herein. In some examples, aspects of the operations of 920 may be performed by an access component as described with reference to FIG. 7.

In some examples, an apparatus as described herein may perform a method or methods, such as the method 900. The apparatus may include features, means, or instructions (e.g., a non-transitory computer-readable medium storing instructions executable by a processor) for receiving an activate command at a memory device that includes a memory array, receiving an access command at the memory device after receiving the activate command, activating, in response to receiving the access command, error correction code circuitry coupled with the memory array, and accessing one or more memory cells within a bank of the memory array based on activating the error correction code circuitry.

Some examples of the method 900 and the apparatus described herein may further include operations, features, means, or instructions for activating, in response to receiving the activate command and before receiving the access command, the bank of the memory array.

In some examples of the method 900 and the apparatus described herein, the access command may be a write command, and the apparatus may include operations, features, means, or instructions for receiving a set of data associated with the write command, generating, by the error correction code circuitry, an error correction code for the set of data, where accessing the one or more memory cells includes storing the error correction code at the one or more memory cells, and storing the set of data at one or more additional memory cells of the memory array.

In some examples of the method 900 and the apparatus described herein, the access command may be a read command, and the apparatus may include operations, features, means, or instructions for retrieving a first set of data associated with the read command from one or more additional memory cells of the memory array, retrieving an error correction code for the first set of data from the memory array, where accessing the one or more memory cells may include operations, features, means, or instructions for retrieving the error correction code from the one or more memory cells, performing, using the error correction code, an error correction procedure for the first set of data based on the retrieved error correction code to generate a second set of data, and transmitting the second set of data.

In some examples of the method 900 and the apparatus described herein, the error correction code circuitry may be activated based on a latency relative to an edge of a clock signal, and the edge may be concurrent with the access command being received. In some examples of the method 900 and the apparatus described herein, the edge may be a falling edge of the clock signal.

Some examples of the method 900 and the apparatus described herein may further include operations, features, means, or instructions for receiving internal signaling corresponding to the access command at the error correction code circuitry after activating the error correction code circuitry and before accessing the one or more memory cells within the bank of the memory array.

In some examples of the method 900 and the apparatus described herein, the internal signaling may be or include column redundancy signaling.

Some examples of the method 900 and the apparatus described herein may further include operations, features, means, or instructions for receiving a precharge command at the memory device, and deactivating, in response to receiving the precharge command, the error correction code circuitry.

It should be noted that the methods described herein are possible implementations, and that the operations and the steps may be rearranged or otherwise modified and that other implementations are possible. Further, portions from two or more of the methods may be combined.

An apparatus is described. The apparatus may include a die. The die may include row logic circuitry, a bank of a memory array where the bank is coupled with the row logic circuitry, and a controller coupled with the row logic circuitry and the bank. The controller may be configured to receive an activate command at the die, activate, in response to receiving the activate command, the row logic circuitry, activate, in response to receiving the activate command, the bank after activating the row logic circuitry, and perform, after activating the bank and using the row logic circuitry, an access operation for one or more memory cells within the bank.

In some examples, the die may further include a first set of power supply nodes configured to have a first voltage differential, and a second set of power supply nodes configured to have a second voltage differential and coupled with the row logic circuitry. The second voltage differential may be smaller than the first voltage differential. The controller may be further configured to activate the row logic circuitry based at least in part on coupling one or more of the first set of power supply nodes with one or more of the second set of power supply nodes.

In some examples, the row logic circuitry may include control logic coupled with one or more sense amplifiers of the bank and may be configured to activate the one more sense amplifiers. In some examples, the row logic circuitry may include one or more word line drivers coupled with one or more word lines of the bank and may be configured to activate the one or more word lines.

In some examples, the controller may be further configured to receive a precharge command at the die and deactivate, in response to receiving the precharge command, the row logic circuitry.

An apparatus is described. The apparatus may include a die, and the die may include error correction code circuitry, a bank of a memory array where the bank may be coupled with the error correction code circuitry, and a controller coupled with the error correction code circuitry and the bank. The controller may be configured to receive an activate command at the die, receive an access command at the die after receiving the activate command, activate, in response to receiving the access command, the error correction code circuitry, and access one or more memory cells within the bank based on activating the error correction code circuitry.

In some examples, the die further may include column logic circuitry coupled with the bank, and a buffer coupled with the bank. The controller may be further configured to activate the column logic circuitry, the buffer, or both after receiving the activate command and before activating the error correction code circuitry.

In some examples, the die further may include a first set of power supply nodes configured to may have a first voltage differential, and a second set of power supply nodes configured to may have a second voltage differential and coupled with the error correction code circuitry. The second voltage differential may be smaller than the first voltage differential. The controller may be further configured to activate the error correction code circuitry based on coupling one or more of the first set of power supply nodes with one or more of the second set of power supply nodes.

In some examples, the controller may be further configured to receive a precharge command at the die and deactivate, in response to receiving the precharge command, the error correction code circuitry.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) may not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent each of the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   receiving an activate command at a memory device that comprises a memory array;
   activating, in response to receiving the activate command, row logic circuitry coupled with the memory array;
   activating, in response to receiving the activate command, a bank of the memory array after activating the row logic circuitry, wherein the row logic circuitry is activated based at least in part on a latency relative to an edge of a clock signal; and
   performing, after activating the bank and the row logic circuitry, an access operation for one or more memory cells within the bank.

2. The method of claim 1, wherein the edge is concurrent with the activate command being received.

3. The method of claim 2, wherein the edge is a falling edge of the clock signal.

4. The method of claim 3, further comprising:
receiving a second activate command prior to the activate command, wherein the row logic circuitry is activated in response to receiving the activate command and the second activate command.

5. A method, comprising:
receiving an activate command at a memory device that comprises a memory array;
activating, in response to receiving the activate command, row logic circuitry coupled with the memory array;
activating, in response to receiving the activate command, a bank of the memory array after activating the row logic circuitry;
performing, after activating the bank and the row logic circuitry, an access operation for one or more memory cells within the bank;
receiving a precharge command at the memory device; and
deactivating, in response to receiving the precharge command, the row logic circuitry.

6. A method comprising:
operating a memory array in a stand-by mode prior to receiving an activate command, wherein row logic circuitry is deactivated when the memory array is in the stand-by mode;
receiving the activate command at a memory device that comprises the memory array, wherein the row logic circuitry is deactivated when the memory device receives the activate command;
activating, in response to receiving the activate command, the row logic circuitry coupled with the memory array;
activating, in response to receiving the activate command, a bank of the memory array after activating the row logic circuitry; and
performing, after activating the bank and the row logic circuitry, an access operation for one or more memory cells within the bank.

7. A method comprising:
operating a memory array in a power-down mode prior to receiving an activate command, wherein row logic circuitry is deactivated when the memory array is in the power-down mode;
receiving the activate command at a memory device that comprises a memory array, wherein the row logic circuitry is deactivated when the memory device receives the activate command;
activating, in response to receiving the activate command, the row logic circuitry coupled with the memory array;
activating, in response to receiving the activate command, a bank of the memory array after activating the row logic circuitry; and
performing, after activating the bank and the row logic circuitry, an access operation for one or more memory cells within the bank.

8. A method, comprising:
receiving an activate command at a memory device that comprises a memory array;
receiving an access command at the memory device after receiving the activate command;
activating, in response to receiving the access command, error correction code circuitry coupled with the memory array; and
accessing one or more memory cells within a bank of the memory array based at least in part on activating the error correction code circuitry.

9. The method of claim 8, further comprising:
activating, in response to receiving the activate command and before receiving the access command, the bank of the memory array.

10. The method of claim 8, wherein the access command comprises a write command, the method further comprising:
receiving a set of data associated with the write command;
generating, by the error correction code circuitry, an error correction code for the set of data, wherein accessing the one or more memory cells comprises storing the error correction code at the one or more memory cells; and
storing the set of data at one or more additional memory cells of the memory array.

11. The method of claim 8, wherein the access command comprises a read command, the method further comprising:
retrieving a first set of data associated with the read command from one or more additional memory cells of the memory array;
retrieving an error correction code for the first set of data from the memory array, wherein accessing the one or more memory cells comprises retrieving the error correction code from the one or more memory cells;
performing, using the error correction code, an error correction procedure for the first set of data to generate a second set of data; and
transmitting the second set of data.

12. The method of claim 8, wherein the error correction code circuitry is activated based at least in part on a latency relative to an edge of a clock signal, and wherein the edge is concurrent with the access command being received.

13. The method of claim 12, wherein the edge is a falling edge of the clock signal.

14. The method of claim 8, further comprising:
receiving internal signaling corresponding to the access command at the error correction code circuitry after activating the error correction code circuitry and before accessing the one or more memory cells within the bank of the memory array.

15. The method of claim 14, wherein the internal signaling comprises column redundancy signaling.

16. The method of claim 8, further comprising:
receiving a precharge command at the memory device; and
deactivating, in response to receiving the precharge command, the error correction code circuitry.

17. An apparatus, comprising:
a die, comprising:
row logic circuitry;
a bank of a memory array, the bank coupled with the row logic circuitry;
a first set of power supply nodes configured to have a first voltage differential;
a second set of power supply nodes configured to have a second voltage differential and coupled with the row logic circuitry, wherein the second voltage differential is smaller than the first voltage differential; and
a controller coupled with the row logic circuitry and the bank, wherein the controller is configured to:
receive an activate command at the die;
activate, in response to receiving the activate command, the row logic circuitry based at least in part on coupling one or more of the first set of power supply nodes with one or more of the second set of power supply nodes;

activate, in response to receiving the activate command, the bank after activating the row logic circuitry; and perform, after activating the bank and using the row logic circuitry, an access operation for one or more memory cells within the bank.

18. The apparatus of claim 17, wherein the row logic circuitry comprises control logic coupled with one or more sense amplifiers of the bank and is configured to activate the one or more sense amplifiers.

19. The apparatus of claim 17, wherein the row logic circuitry comprises one or more word line drivers coupled with one or more word lines of the bank and is configured to activate the one or more word lines.

20. An apparatus, comprising:
a die, comprising:
row logic circuitry;
a bank of a memory array, the bank coupled with the row logic circuitry; and
a controller coupled with the row logic circuitry and the bank, wherein the controller is configured to:
receive an activate command at the die;
activate, in response to receiving the activate command, the row logic circuitry;
activate, in response to receiving the activate command, the bank after activating the row logic circuitry;
perform, after activating the bank and using the row logic circuitry, an access operation for one or more memory cells within the bank;
receive a precharge command at the die; and
deactivate, in response to receiving the precharge command, the row logic circuitry.

21. An apparatus, comprising:
a die, comprising:
an error correction code circuitry;
a bank of a memory array, the bank coupled with the error correction code circuitry; and
a controller coupled with the error correction code circuitry and the bank, wherein the controller is configured to:
receive an activate command at the die;
receive an access command at the die after receiving the activate command;
activate, in response to receiving the access command, the error correction code circuitry; and
access one or more memory cells within the bank based at least in part on activating the error correction code circuitry.

22. The apparatus of claim 21, wherein the die further comprises:
column logic circuitry coupled with the bank; and
a buffer coupled with the bank, wherein the controller is further configured to:
activate the column logic circuitry, the buffer, or both after receiving the activate command and before activating the error correction code circuitry.

23. The apparatus of claim 21, wherein the die further comprises:
a first set of power supply nodes configured to have a first voltage differential; and
a second set of power supply nodes configured to have a second voltage differential and coupled with the error correction code circuitry, wherein the second voltage differential is smaller than the first voltage differential and wherein the controller is further configured to:
activate the error correction code circuitry based at least in part on coupling one or more of the first set of power supply nodes with one or more of the second set of power supply nodes.

24. The apparatus of claim 21, wherein the controller is further configured to:
receive a precharge command at the die; and
deactivate, in response to receiving the precharge command, the error correction code circuitry.

* * * * *